(12) United States Patent
Chien et al.

(10) Patent No.: US 8,994,468 B2
(45) Date of Patent: Mar. 31, 2015

(54) MODULATION METHOD AND CONTROL DEVICE HAVING THE SAME

(71) Applicant: Industrial Technology Research Institute, Hsin-Chu (TW)

(72) Inventors: Shih-Hsiang Chien, Yilan County (TW); Yong-Kai Lin, New Taipei (TW); Chin-Hone Lin, Nantou County (TW)

(73) Assignee: Industrial Technology Research Institute, Hsin-Chu (TW)

( * ) Notice: Subject to any disclaimer, the term of this patent is extended or adjusted under 35 U.S.C. 154(b) by 58 days.

(21) Appl. No.: 13/894,784

(22) Filed: May 15, 2013

(65) Prior Publication Data

US 2014/0167872 A1 Jun. 19, 2014

(30) Foreign Application Priority Data

Dec. 18, 2012 (TW) .............................. 101148074 A (51) Int. Cl.

| | |
|---|---|
| H03K 7/08 | (2006.01) |
| H02H 3/00 | (2006.01) |
| G05F 1/613 | (2006.01) |
| H03K 5/156 | (2006.01) |
| G05F 1/70 | (2006.01) |
| H02M 3/158 | (2006.01) |

(52) U.S. Cl.
CPC ................ *H03K 7/08* (2013.01); *H02H 3/006* (2013.01); *G05F 1/613* (2013.01); *H03K 5/1565* (2013.01); *G05F 1/70* (2013.01); *H02M 3/1588* (2013.01); *H02H 3/00* (2013.01)
USPC ........... 332/109; 332/106; 327/175; 323/205; 323/271; 323/222; 323/223; 700/292; 700/293

(58) Field of Classification Search
CPC ........ G05F 1/70; G05F 1/613; H02M 3/1588; H03K 5/1565; H02H 3/006; H01H 2071/006
USPC ........... 332/106, 109; 327/175; 323/205, 271, 323/222, 223; 700/292, 293
See application file for complete search history.

(56) References Cited

U.S. PATENT DOCUMENTS

| | | | |
|---|---|---|---|
| 4,945,542 | A | 7/1990 | Brothers, Jr. |
| 5,412,809 | A | 5/1995 | Tam et al. |
| 6,038,146 | A | 3/2000 | Luo et al. |
| 6,683,799 | B2 | 1/2004 | Kato et al. |
| 6,777,899 | B1 | 8/2004 | Plutowski |
| 7,091,681 | B2 | 8/2006 | Xi et al. |
| 2010/0164579 | A1 | 7/2010 | Acatrinei |

(Continued)

FOREIGN PATENT DOCUMENTS

| | | |
|---|---|---|
| TW | 200408183 | 5/2004 |
| TW | I279509 | 4/2007 |

(Continued)

*Primary Examiner* — Arnold Kinkead
(74) *Attorney, Agent, or Firm* — WPAT, PC; Justin King (57) ABSTRACT

A modulation method is provided. The modulation method includes the steps of receiving multiple sinusoidal signals, obtaining the maximum value of the sinusoidal signals, obtaining the median value of the sinusoidal signals, and obtaining the minimum value of the sinusoidal signals within a period to generate a difference between the maximum value and the minimum value, generating a difference according to an upper limit and a lower limit of a predetermined comparison value, and comparing the two differences to generate an optimized modulation signal.

8 Claims, 7 Drawing Sheets

(56) References Cited

U.S. PATENT DOCUMENTS

| | | | |
|---|---|---|---|
| 2012/0147638 A1* | 6/2012 | Kitanaka | 363/95 |
| 2012/0212191 A1* | 8/2012 | Yuzurihara et al. | 323/205 |
| 2013/0320951 A1* | 12/2013 | Wu et al. | 323/311 |
| 2014/0218117 A1* | 8/2014 | Branca et al. | 330/297 |

FOREIGN PATENT DOCUMENTS

| | | |
|---|---|---|
| TW | I292250 | 1/2008 |
| TW | 200939610 | 9/2009 |
| TW | 201136135 | 10/2011 |

* cited by examiner

MODULATION METHOD AND CONTROL DEVICE HAVING THE SAME

This application claims the benefit of Taiwan application Serial No. 101148074, filed Dec. 18, 2012, the disclosure of which is incorporated by reference herein in its entirety.

TECHNICAL FIELD

The disclosed embodiments relate in general to a modulation method and a control device having the modulation method, and more particularly to a modulation method for eliminating a current surge and a control device applying the modulation method.

BACKGROUND

In a conventional control technique, an input value approaches a maximum value in the event of a high-load demand, with however performance at a load appearing stagnant instead of increasing at a direct proportion. That is, saturation has reached as the input signal is incapable of providing more energy to the load, such that a surge is caused. A maximum value of the surge wave is often extremely close to a maximum load of a power element, in a way that a power stage becomes constantly exposed to risks of being burned and damaged.

In one conventional technique, a surge signal is mitigated or eliminated using a circuit hardware design, which disposes an extra detection device at a control circuit board. To further ensure the functionality of the device, an additional associated activation power is provided. Thus, not only operation performance of the control device is degraded but also the volume and costs of the control device are increased. Meanwhile, associated configurations of connected sub-systems and components also need to be adjusted, further complicating the overall design. In another conventional technique, specifications of the power element are augmented with increased power volume and size to prevent burning and malfunction of the power stage of the control device. Alternatively, rather than changing the specifications, a filter circuit and a capacitor of higher specifications are additionally provided for filtering and removing harmonic signals accompanying the surge wave. Such method, although capable of lowering possibilities of system malfunction, significantly increases manufacturing costs. In another method, an amplitude of the input signal may be reduced to decrease the amount of the surge wave. However, this method undesirably affects a power output of the load, such that the system is restrained from exercising maximum performance required by specifications and results in a cost waste.

SUMMARY

According to one embodiment, a modulation method is provided. The modulation method includes steps of: receiving multiple sinusoidal signals; obtaining a maximum value, a median value and a minimum value of the sinusoidal signals within a period to generate a first difference between the maximum value and the minimum value; generating a second difference according to an upper limit and a lower limit of a predetermined comparison value; and comparing the first difference with the second difference to generate an optimized modulation signal.

According to an alternative embodiment, a control device applying a modulation method is provided. The control device includes: a controller, for sending multiple sinusoidal signals; a modulation system, coupled to the controller, for receiving and adjusting the sinusoidal signals and generating an optimized modulation signal; a pulse-width modulation (PWM) generator, coupled to the modulation system, for receiving and outputting the sinusoidal signals; a filter, coupled to the PWM generator, for obtaining two sinusoidal signals from the sinusoidal signals as an input source; a subtraction circuit, connected in series to the filter, for subtracting the two sinusoidal signals to generate a difference and inputting the difference to the modulation system; a power element, coupled to the PWM generator, for controlling a load; and a power supply, coupled to the power element, for powering the power element.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 1:
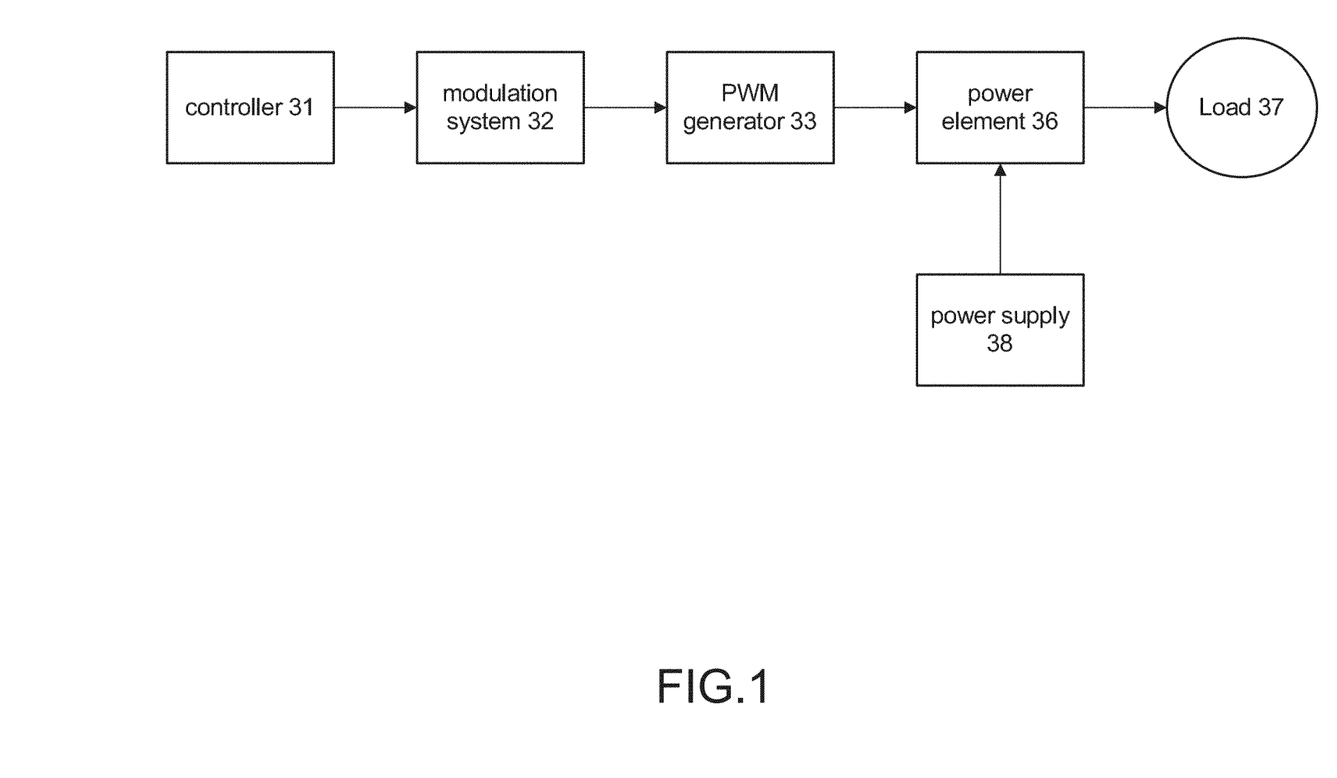
FIG. 1 is a control device having a modulation method for eliminating a current surge according to one embodiment.

FIG. 1 shows a control device having a modulation method for eliminating a current surge according to one embodiment. Referring to FIG. 1, the control device includes a controller 31, a modulation system 32, a pulse-width modulation (PWM) generator 33, a power element 36, a load 37 and a power supply 38. The controller 31 generates multiple sinusoidal signals, and includes a control circuit or a control chip. A method for controlling the load 37 may be burned in the control chip to perform corresponding control operations. The modulation system 32, coupled to the controller 31, receives and adjusts the sinusoidal signals to generate optimized modulation signals. The PWM generator 33, coupled to the modulation system 32, receives and outputs the sinusoidal signals. The power element 36, coupled to the PWM generator 37, controls the load 37. The power supply 38, coupled to the power element 36, includes a battery device.

Within a period, the modulation system 32 obtains a maximum value $v_{max}$, a median value $v_{med}$ and a minimum value $v_{min}$ of the sinusoidal signals to generate a first difference $v_{eff}$ between the maximum value $v_{max}$ and the minimum value $v_{min}$. The modulation system 32 further generates a second difference $v_{diff}$ according to an upper limit MAX and a lower limit MIN according to a predetermined comparison value. In other words, assuming that the predetermined value is a continuous wave (e.g., a triangle wave), a peak value MAX and a valley value MIN of the continuous wave may be obtained to generate the second difference $v_{diff}$ according to the peak value MAX and the valley value MIN. The modulation system 32 compares the first difference $v_{eff}$ with the second difference $v_{diff}$ to generate the optimized modulation signals.

When the first difference $v_{eff}$ is smaller than the second difference $v_{diff}$, i.e., $v_{eff}<v_{diff}$, the modulation system 32 adds the negative minimum value to the negative maximum value, and divides the sum by a predetermined value to generate a first adjustment value $v_{offset}$, where the predetermined value is 2. The first adjustment value $v_{offset}$ may be further simplified as $(-v_{max}-v_{min})/2$. The first adjustment value $v_{offset}$ is added to the maximum value $v_{max}$, the median value $v_{med}$ and the minimum value $v_{min}$ to adjust and optimize the modulation signals. When the first difference $v_{eff}$ is greater than the second difference $v_{diff}$, i.e., $v_{eff}>v_{diff}$, the modulation system 32 generates a median value $v_{med'}$. The median value $v_{med'}=\{\{$lower limit MIN+[second difference $v_{diff}\times(-$maximum value $v_{max}-$minimum value $v_{min}\times 2)]\}/$first difference $v_{eff}\}$. Therefore, the median value $v_{med'}$ may be further simplified as $\{\{$MIN+$[v_{diff}\times(-v_{max}-2v_{min})]\}/v_{eff}\}$. The modulation system 32 may respectively adjust the median value $v_{med'}$, the maximum value $v_{max}$ and the minimum value $v_{min}$ to the median value $v_{med'}$, the upper peak value limit MAX and the lower valley value limit MIN.

Figure 2:
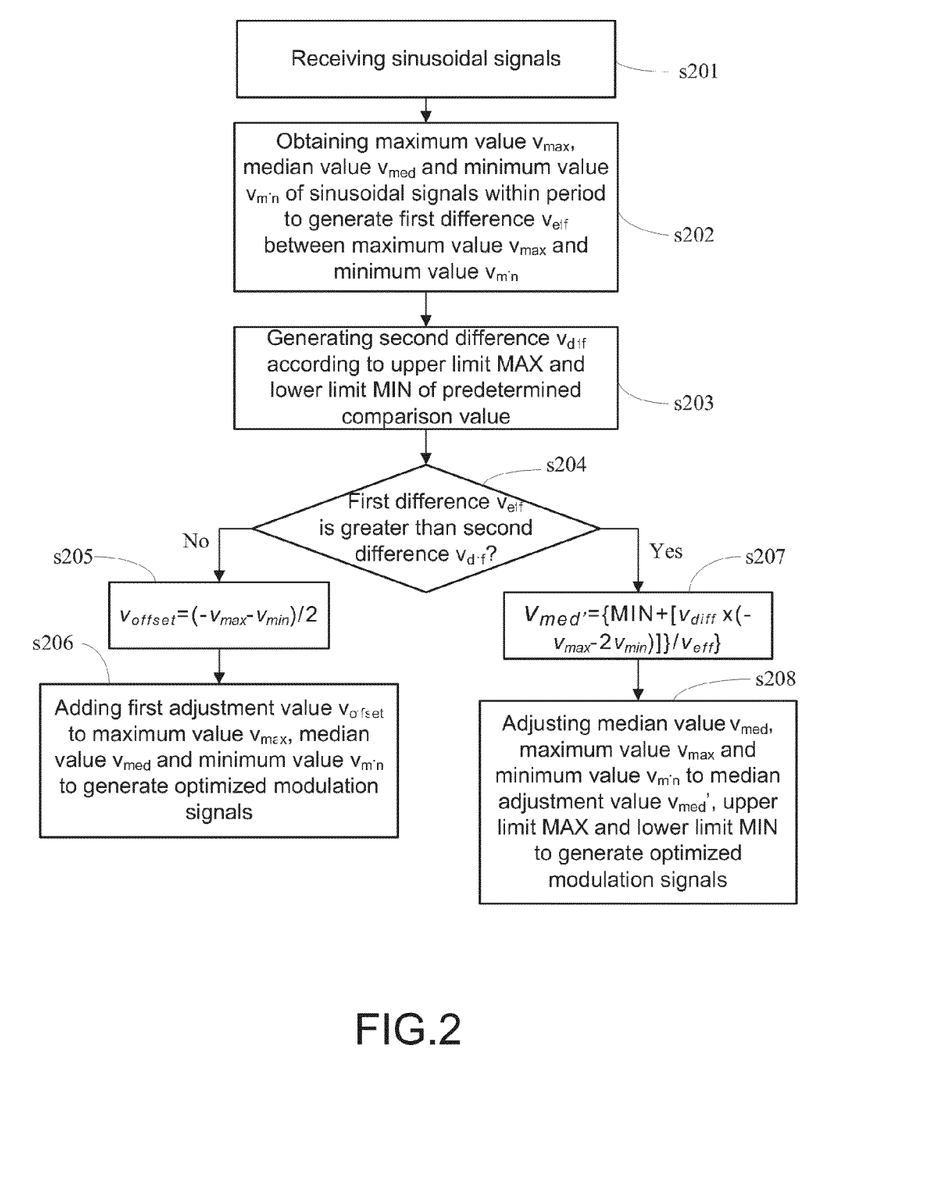
FIG. 2 is a flowchart of a modulation method for eliminating a current surge according to one embodiment.

FIG. 2 shows a flowchart of a modulation method for eliminating a surge current according to one embodiment. The modulation method, applicable to the modulation device in FIG. 1, includes the following steps. In step s201, multiple sinusoidal signals are received. In step s202, within a period, a maximum value $v_{max}$, a median value $v_{med}$ and a minimum value $v_{min}$ of the sinusoidal signals are obtained to generate a first difference $v_{eff}$ between the maximum value $v_{max}$ and the minimum value $v_{min}$. In step s203, a second difference $v_{diff}$ is generated according to an upper limit MAX and a lower limit MIN of a predetermined comparison value. In step s204, the first difference $v_{eff}$ is compared with the second difference $v_{diff}$ to generate optimized modulation signals.

In step s205, when the first difference $v_{eff}$ is smaller than the second difference $v_{diff}$, i.e., $v_{eff}<v_{diff}$, the modulation system 32 adds the negative minimum value to the negative maximum value, and the sum is divided by a predetermined value to generate a first adjustment value $v_{offset}$, where the predetermined value is 2. The first adjustment value $v_{offset}$ may be further simplified as $(-v_{max}-v_{min})/2$. In step s206, the first adjustment value $v_{offset}$ is added to the maximum value $v_{max}$, the median value $v_{med}$ and the minimum value $v_{min}$ to output optimized modulation signals. For example, referring to FIG. 3A, multiple sinusoidal signals $v_{as}$, $v_{bs}$ and $v_{cs}$ are received. Within a period, a maximum value $v_{max}$, a median value $v_{med}$ and a minimum value $v_{min}$ are obtained from the sinusoidal signals $v_{as}$, $v_{bs}$ and $v_{cs}$, where $v_{bs}=v_{max}$) $v_{as}=v_{med}$) and $v_{cs}=v_{min}$. A first difference $v_{eff}$ is generated according to the maximum value $v_{max}$ and the minimum value $v_{min}$. A second difference $v_{diff}$ is then generated according to an upper limit MAX and a lower limit MIN of a predetermined comparison value. The first difference $v_{eff}$ is compared with the second difference $v_{diff}$. When the first difference $v_{eff}$ is smaller than the second difference $v_{diff}$, i.e., $v_{eff}<v_{diff}$, the first adjustment value $v_{offset}$ is generated, and the first adjustment value $v_{offset}$ is added to the maximum value $v_{max}$ ($v_{bs}$), the median value $v_{med}$ ($v_{as}$) and the minimum value $v_{min}$ ($v_{cs}$) to generate and output the optimized modulation signals, respectively. For example, the optimized modulation signals after adjusting the sinusoidal signals may be represented as $v_{bs}=v_{bs}+v_{offset}$, $v_{as}=v_{as}+v_{offset}$ and $v_{cs}=v_{cs}+v_{offset}$.

In step s207, in contrast, when the first difference $v_{eff}$ is greater than the second difference $v_{diff}$, i.e., $v_{eff}>v_{diff}$, a median value $v_{med'}$ is generated. The median value $v_{med'}=\{\{$lower limit MIN+[second difference $v_{diff}\times(-$maximum value $v_{max}-$minimum value $v_{min}\times 2)]\}/$first difference $v_{eff}\}$. Therefore, the median value $v_{med'}$ may be further simplified as $\{\{$MIN+$[v_{diff}\times(-v_{max}-2v_{min})]\}/v_{eff}\}$. In step s208, the median value $v_{med'}$, the maximum value $v_{max}$ and the minimum value $v_{min}$ are respectively adjusted to the median value $v_{med'}$, the upper peak value limit MAX and the lower valley value limit MIN. For example, referring to FIG. 3A, when the first difference $v_{eff}$ is greater than the second difference $v_{diff}$, i.e., $v_{eff}>v_{diff}$, a median value $v_{med'}$ is generated. The median value $v_{med'}$, the maximum value $v_{max}$ and the minimum value $v_{min}$ are then respectively adjusted to the median value $v_{med'}$, the upper peak value limit MAX and the lower valley value limit MIN to generate and output the optimized modulation signals. For example, the optimized modulation signals after adjusting the sinusoidal signals are represented as $v_{as}=v_{med'}$, $v_{bs}=$MAX and $v_{cs}=$MIN.

Figure 3A:
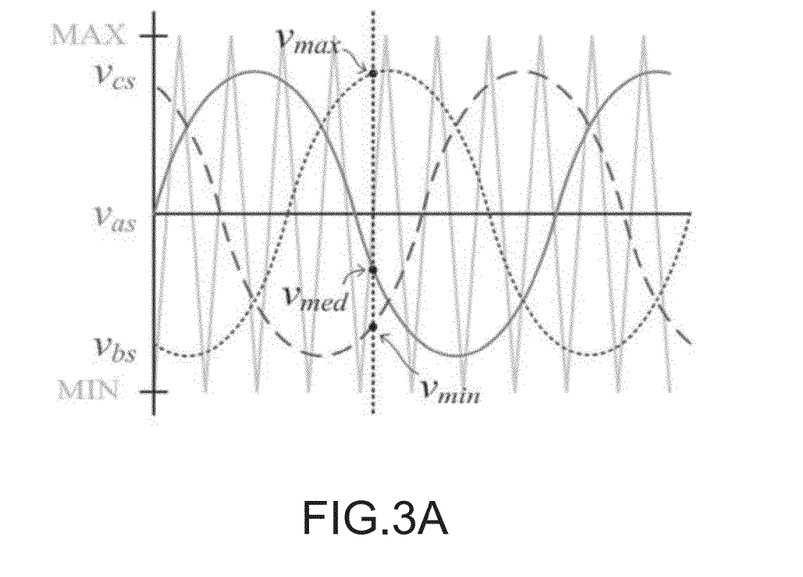
FIGS. 3A-3B and 4A-4B are waveforms of an exemplary application according to one embodiment.
Figure 3B:
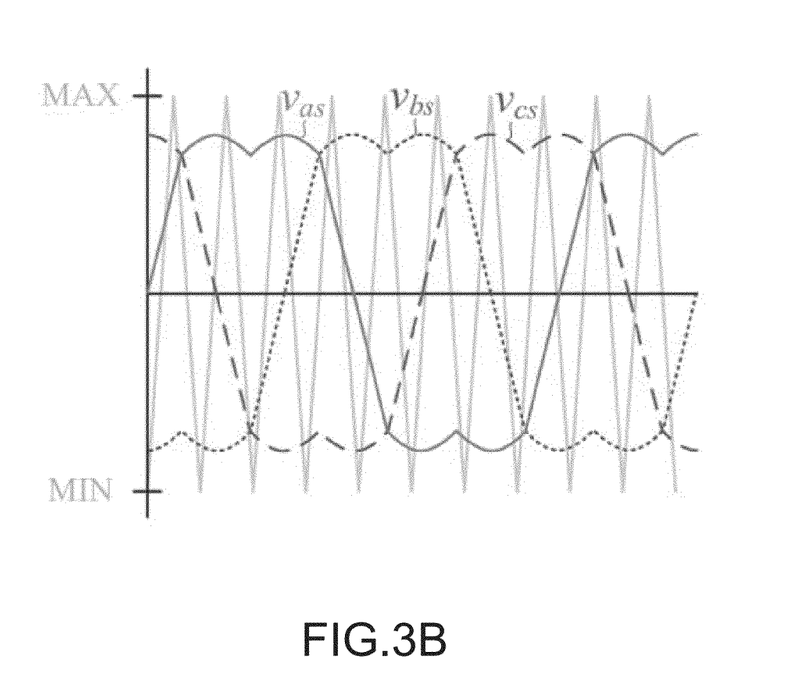
Figure 4A:
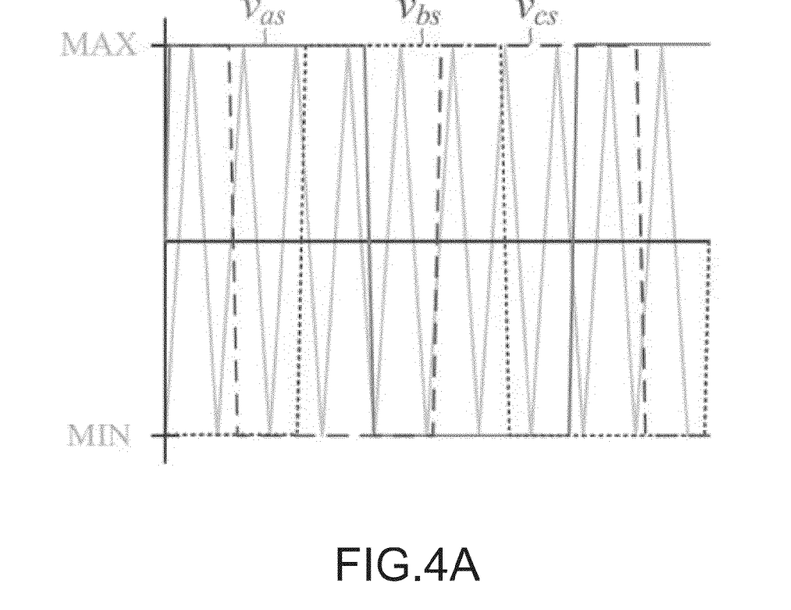
Figure 4B:
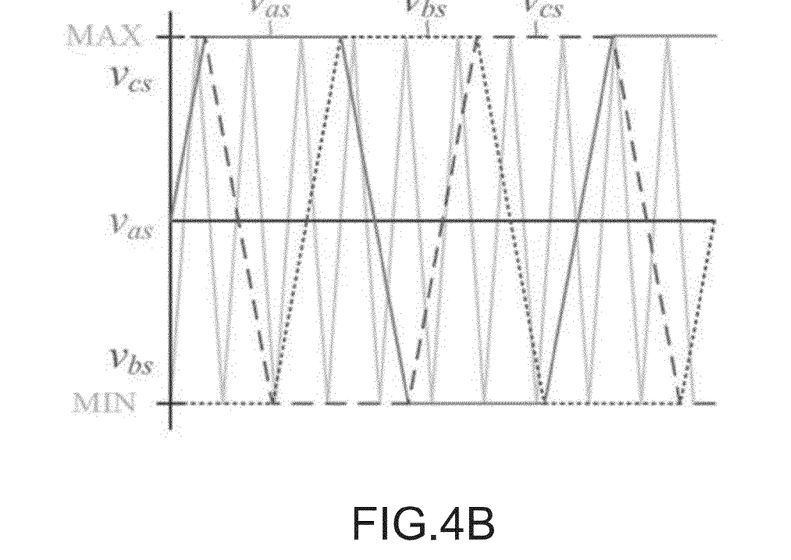

FIGS. 3 and 4 are waveforms of an exemplary application according to one embodiment. The waveforms in FIGS. 3 and 4 are to be described in detail with reference to FIG. 2. FIG. 3A shows a waveform before step s205 of the embodiment, and FIG. 3B shows an optimized waveform after the adjustment step. FIG. 4A shows a waveform before step s207 of the embodiment, and FIG. 4B shows an optimized waveform after the adjustment step.

Figure 5:
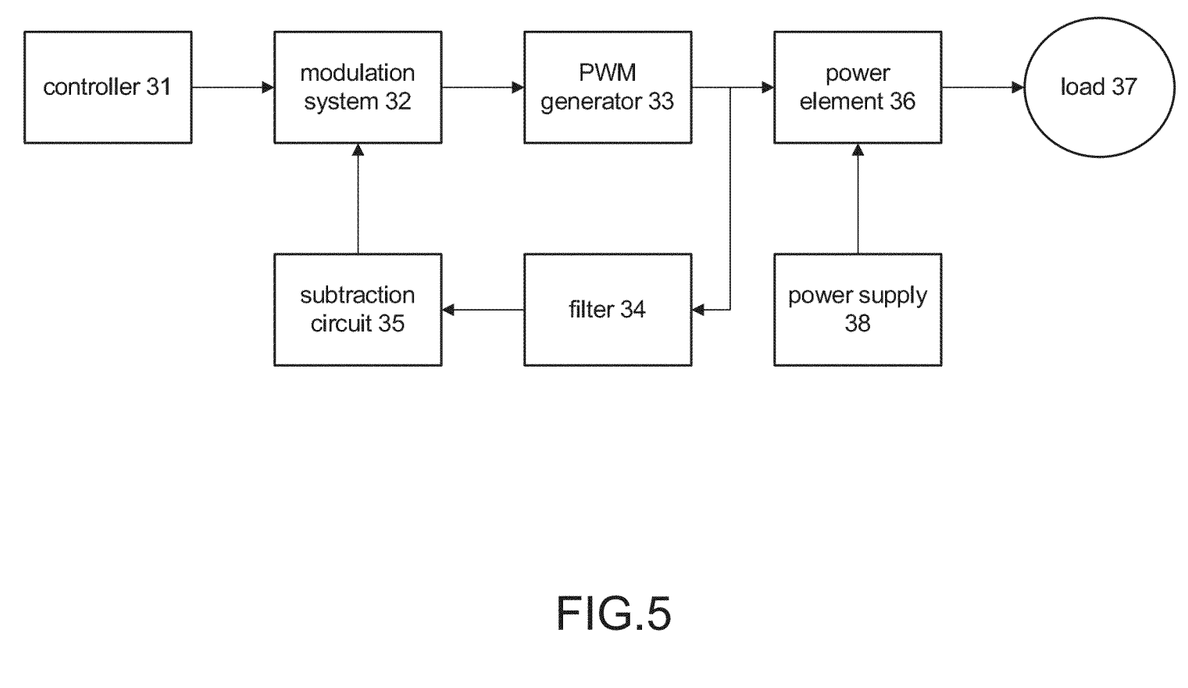
FIG. 5 is a control device according to another embodiment.

FIG. 5 shows a control device according to another embodiment. Referring to FIG. 5, the modulation system includes a controller 31, a modulation system 32, a PWM generator 33, a power element 36, a load 37 and a power supply 38. The controller 31 generates multiple sinusoidal signals, and includes a control circuit or a control chip. A method for controlling the load 37 may be burned in the control chip to perform corresponding control operations. The modulation system 32, coupled to the controller 31, receives and adjusts the sinusoidal signals to generate optimized modulation signals. The PWM generator 33, coupled to the modulation system 32, receives and outputs the sinusoidal signals. The filter 34, coupled to the PWM generator 33, obtains two sinusoidal signals from the sinusoidal signals as an input source. The subtraction circuit 35, connected in series to the filter 34, subtracts the two sinusoidal signals to generate a difference, and inputs the difference to the modulation system 32. The power element 36, coupled to the PWM generator 37, controls the load 37. The power supply 38, coupled to the power element 36, includes a battery device.

Figure 6:
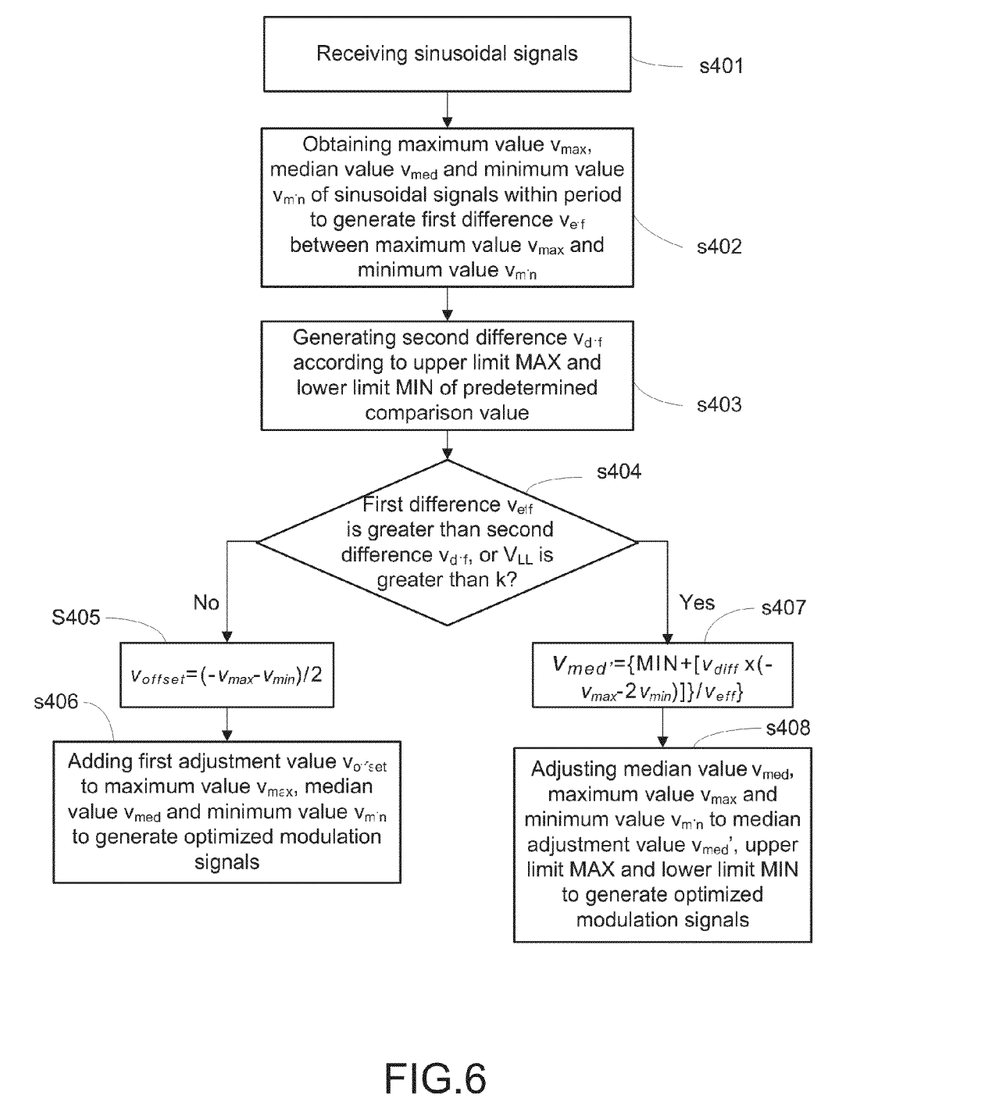
FIG. 6 is a flowchart of a modulation method according to one embodiment.

FIG. 6 shows a flowchart of a modulation method applied to the control device in FIG. 5. The modulation method according to this embodiment is similar to that of the foregoing embodiment, with a main difference being that a linear voltage $V_{LL}$ is considered in this embodiment. Referring to FIG. 6, the modulation method includes the following steps. In step s401, multiple sinusoidal signals are received. In step s402, within a period, a maximum value $v_{max}$, a median value $v_{med}$ and a minimum value $v_{min}$ of the sinusoidal signals are obtained to generate a first difference $v_{eff}$ between the maximum value $v_{max}$ and the minimum value $v_{min}$. In step s403, a second difference $v_{diff}$ is generated according to an upper limit MAX and a lower limit MIN of a predetermined comparison value. In step s404, the first difference $v_{eff}$ is compared with the second difference $v_{diff}$ to output optimized modulation signals.

In step s405, when the first difference $v_{eff}$ is smaller than the second difference $v_{diff}$, i.e., $v_{eff}<v_{diff}$, or when the linear voltage $V_{LL}$ is smaller than a constant value k, i.e., $V_{LL}<k$, the negative minimum value is added to the negative maximum value, and the sum is divided by a predetermined value to generate a first adjustment value $v_{offset}$, where the predetermined value is 2. The first adjustment value $v_{offset}$ may be further simplified as $(-v_{max}-v_{min})/2$. In step s406, the first adjustment value $v_{offset}$ is added to the maximum value $v_{max}$, the median value $v_{med}$ and the minimum value $v_{min}$ to output the optimized modulation signals. In step 407, in contrast, when the first difference $v_{eff}$ is greater than the second difference $v_{diff}$, i.e., $v_{eff} > v_{diff}$, or when the linear voltage $V_{LL}$ is greater than the constant value k, i.e., $V_{LL} > k$, a median value $v_{med'}$ is generated. The median value $v_{med'} = \{\{\text{lower limit MIN} + [\text{second difference } v_{diff} \times (-\text{maximum value } v_{max} - \text{minimum value } v_{min} \times 2)]\}/\text{first difference } v_{eff}\}$. Therefore, the median value $v_{med'}$ may be further simplified as $\{\{MIN + [v_{diff} \times (-v_{max} - 2v_{min})]\}/v_{eff}\}$. In step s408, the median value $v_{med}$, the maximum value $v_{max}$ and the minimum value $v_{min}$ are respectively adjusted to the median value $v_{med'}$, the upper peak value limit MAX and the lower valley value limit MIN. In this embodiment, a three-phase voltage sinusoidal signal is taken as an example. However, the embodiment is not limited to a voltage signal, and multi-phase or reference signals of other physical properties may be applied given that the signals satisfy properties of sinusoidal signals. As shown in FIG. 3A, the three-phase modulation voltage signals are respectively $\{v_{as}, v_{bs}, v_{cs}\}$, which have a phase difference of 120 degrees from one another, and the same amplitude and period. At one particular time point, the sizes of the three above signals are respectively $\{vmax, vmed, vmin\}$. MAX and MIN are respectively defined as a peak value and a valley value of the triangle wave for counting the input waveform as a reference, based on which PWM generator 33 controls the output modulation signals. The other two signals among the three-phase signals of the PWM generator 33 are connected to a filter 34 for the use of filtering. A subtraction circuit 35 is connected in series to subtract the two-phase signals to obtain the value of the linear voltage $V_{LL}$. The linear voltage $V_{LL}$ may be adjusted according to the input power. As shown by a dotted line in FIG. 3A, on the constant time axis, $v_{bs} = v_{max}$, $v_{as} = v_{med}$, and $v_{cs} = v_{min}$. Thus, $v_{eff}$ may equal to $v_{max} - v_{min}$. If $V_{LL} < k$, or $v_{eff} < v_{diff}$ and the difference is smaller than the constant value k, modulation is performed, or else three-phase signals $\{v_{as}, v_{bs}, v_{cs}\}$ are modulated. In step s405, the negative minimum value is added to the negative maximum value, and the sum is divided by a predetermined value to generate a first adjustment value $v_{offset}$, where the predetermined value is 2. The first adjustment value $v_{offset}$ may be further simplified as $(-v_{max}-v_{min})/2$. In step s406, the first adjustment value $v_{offset}$ is added to the maximum value $v_{max}$, the median value $v_{med}$ and the minimum value $v_{min}$ to output the optimized modulation signals. For example, as shown in FIG. 3A, multiple sinusoidal signals $v_{as}$, $v_{bs}$ and $v_{cs}$ are received. Within a period, a maximum value $v_{max}$, a median value $v_{med}$ and a minimum value $v_{min}$ are obtained from the sinusoidal signals $v_{as}$, $v_{bs}$ and $v_{cs}$, where $v_{bs} = v_{max}$, $v_{as} = v_{med}$, and $v_{cs} = v_{min}$. A first difference $v_{eff}$ is generated according to the maximum value $v_{max}$ and the minimum value $v_{min}$. A second difference $v_{diff}$ is then generated according to an upper limit MAX and a lower limit MIN of a predetermined comparison value. The first difference $v_{eff}$ is compared with the second difference $v_{diff}$. When the first difference $v_{eff}$ is smaller than the second difference $v_{diff}$, i.e., $v_{eff} < v_{diff}$, the first adjustment value $v_{offset}$ is generated, and the first adjustment value $v_{offset}$ is added to the maximum value $v_{max}$ ($v_{bs}$), the median value $v_{med}$ ($v_{as}$) and the minimum value $v_{min}$ ($v_{cs}$) to generate and output the optimized modulation signals, respectively. For example, the optimized modulation signals after adjusting the sinusoidal signals may be represented as $v_{bs} = v_{bs} + v_{offset}$, $v_{as} = v_{as} + v_{offset}$ and $v_{cs} = v_{cs} + v_{offset}$.

However, when $V_{LL} > k$ or $v_{eff} > v_{diff}$ serves as a reference for modulation signals, a median value $v_{med'}$ is generated. The median value $v_{med'} = \{\{\text{lower limit MIN} + [\text{second difference } v_{diff} \times (-\text{maximum value } v_{max} - \text{minimum value } v_{min} \times 2)]\}/\text{first difference } v_{eff}\}$. Therefore, the median value $v_{med'}$ may be further simplified as $\{\{MIN + [v_{diff} \times (-v_{max} - 2v_{min})]\}/v_{eff}\}$. In step s408, the median value $v_{med}$, the maximum value $v_{max}$ and the minimum value $v_{min}$ are respectively adjusted to the median value $v_{med'}$, the upper peak value limit MAX and the lower valley value limit MIN. For example, referring to FIG. 3A, when the first difference $v_{eff}$ is greater than the second difference $v_{diff}$, i.e., $v_{eff} > v_{diff}$, a median value $v_{med'}$ is generated. The median value $v_{med}$, the maximum value $v_{max}$ and the minimum value $v_{min}$ are then respectively adjusted to the median value $v_{med'}$, the upper limit MAX and the lower limit MIN to generate and output the optimized modulation signals. For example, the optimized modulation signals after adjusting the sinusoidal signals are represented as $v_{as} = v_{med'}$, $v_{bs} = $ MAX and $v_{cs} = $ MIN.

Figure 7A:
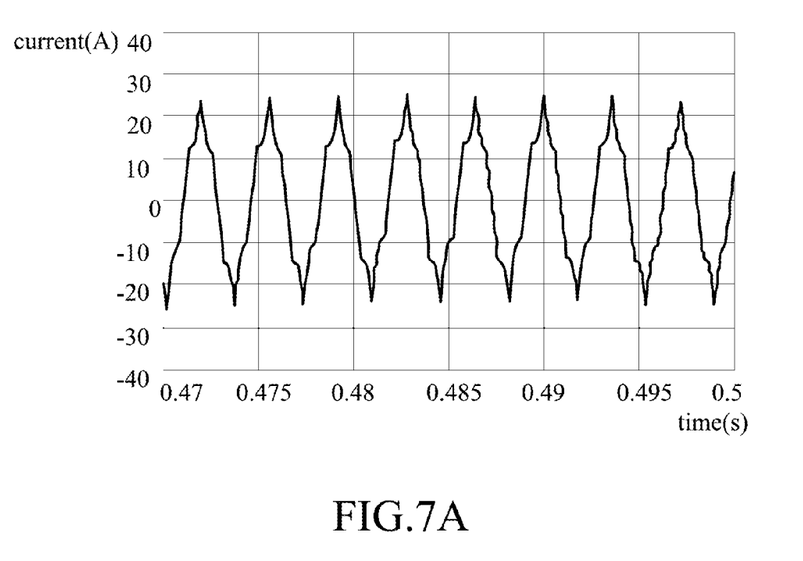
FIGS. 7A and 7B waveforms of an exemplary application according to one embodiment.
Figure 7B:
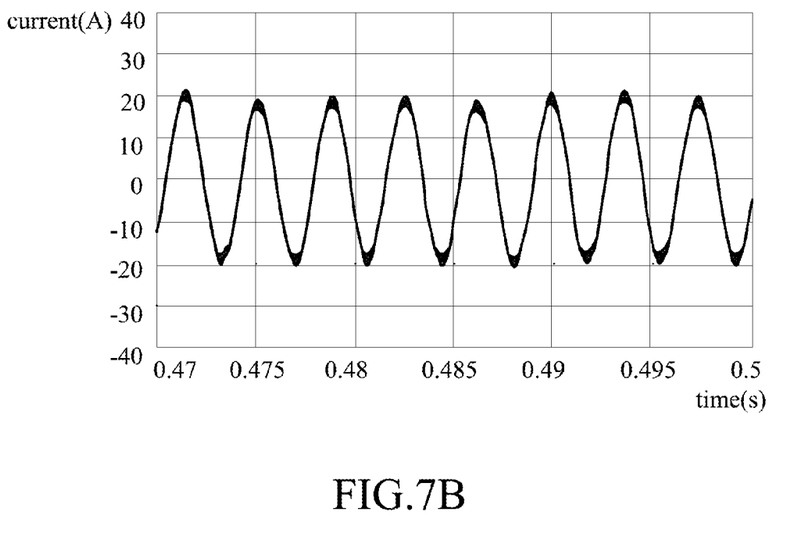

FIG. 7 shows a waveform of an exemplary application according to one embodiment. After processing surge signals (as shown in FIG. 7A) by the embodiments, the surge signals are greatly improved, and a smooth signal waveform as shown FIG. 7B can be obtained.

The modulation method for eliminating a current surge and the control device applying the modulation method disclosed by the embodiments, without changing a volume of a controller mechanism, increasing specifications of the power stage or providing an additionally designed hardware circuit, can be directly integrated to an existing controller. The modulation method and the control device applying the modulation method effectively improves the surges of the control system, in a way that the control signals achieve the maximum input value to allow the load to fully exercise maximum performance. As a result, the input signal waveform outputted to the load may appear smoother to prolong the lifecycle.

With the associated configurations of the controller, the power supply and the load, the modulation method and the control device are designed in the controller to at the same time achieve compactness and enhance added values of the load and the controller. According to a load signal received by a control circuit board of the controller, a sinusoidal signal is outputted to the control device, which operates in conjunction with the modulation method to eliminate the current surge. Thus, the load is allowed to receive a current having a smooth waveform to reduce malfunctions of the load. As a hardware architecture having a complicated circuit, an additional detection device or changes to hardware specifications of the controller are not required, costs of power elements of the controller are reduced and the operation performance of the load is at the same time enhanced. With the design of the modulation device, original specifications and functions of the controller can be left unaffected without any extra design change. In addition to promoting and upgrading the domestic associated controller industry, the embodiments may be extended to applications of electronic apparatuses such as electric automobiles, solar power conversion systems and DC/AC converts.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A modulation method applied to a control device, comprising:
   receiving a plurality of sinusoidal signals;
   within a period, obtaining a maximum value, a median value and a minimum value of the sinusoidal signals to generate a first difference between the maximum value and the minimum value;
   generating a second difference according to an upper limit and a lower limit of a predetermined comparison value; and comparing the first difference with the second difference to generate an optimized modulation signal.

2. The modulation method according to claim 1, further comprising:

when the first difference is smaller than the second difference, adding the maximum value in negative to the minimum value in negative to generate a sum, and dividing the sum by a predetermined value to generate a first adjustment value; and adding the first adjustment value to the maximum value, the median value and the minimum value to generate the optimized modulation signal.

3. The modulation method according to claim 2, wherein the predetermined value is 2.

4. The modulation method according to claim 1, further comprising:

when the first difference is greater than the second difference, generating a median adjustment value; and adjusting the median value, the maximum value and the minimum vale to the median adjustment value, the upper limit and the lower limit, respectively, to generate the optimized modulation signal.

5. The modulation method according to claim 4, wherein the median value is calculated as:

the median value={{the lower limit+[the second difference x(−the maximum value−twice the minimum value)]}/the first difference}.

6. A control device supporting a modulation method, comprising:

a controller, for sending a plurality of sinusoidal signals;

a modulation system, coupled to the controller, for receiving and adjusting the sinusoidal signals;

a pulse-width modulation (PWM) generator, coupled to the modulation system, for receiving and outputting the sinusoidal signals and generating an optimized modulation signal;

a filter, coupled to the PWM generator, for obtaining two sinusoidal signals from the sinusoidal signals to serve as an input source;

a subtraction circuit, connected in series to the filter, for subtracting the two sinusoidal signals to generate a difference, and outputting the difference to the modulation system;

a power element, coupled to the PWM generator, for controlling a load; and a power supply, coupled to the power element, for powering the power element;

wherein, said modulation system adjusts said sinusoidal signals according to said difference.

7. The control device according to claim 6, wherein the controller comprises a control circuit or a control chip.

8. The control device according to claim 6, wherein the power supply comprises a battery device.

* * * * *